United States Patent
Yokozeki

(10) Patent No.: US 8,957,416 B2
(45) Date of Patent: Feb. 17, 2015

(54) THIN FILM TRANSISTOR, MANUFACTURING METHOD OF THE SAME AND ELECTRONIC EQUIPMENT

(71) Applicant: Sony Corporation, Tokyo (JP)

(72) Inventor: Mikihiro Yokozeki, Kanagawa (JP)

(73) Assignee: Sony Corporation, Tokyo (JP)

( * ) Notice: Subject to any disclaimer, the term of this patent is extended or adjusted under 35 U.S.C. 154(b) by 25 days.

(21) Appl. No.: 13/835,405

(22) Filed: Mar. 15, 2013

(65) Prior Publication Data
US 2013/0248852 A1    Sep. 26, 2013

(30) Foreign Application Priority Data
Mar. 23, 2012 (JP) .................... 2012-067662

(51) Int. Cl.
```
H01L 29/12      (2006.01)
H01L 21/04      (2006.01)
H01L 29/786     (2006.01)
H01L 21/02      (2006.01)
```

(52) U.S. Cl.
CPC .......... *H01L 29/786* (2013.01); *H01L 21/0237* (2013.01); *H01L 29/7869* (2013.01); *H01L 21/02565* (2013.01); *H01L 21/02631* (2013.01); *H01L 21/02667* (2013.01)
USPC ....... 257/43; 257/E29.068; 438/104; 438/482

(58) Field of Classification Search
CPC ... H01L 29/12; H01L 21/04; H01L 29/78693; H01L 21/336; H01L 29/786; H01L 21/8247; H01L 29/788; H01L 29/792; H01L 27/115; H01L 21/8242; H01L 27/108; H01L 21/20; H01L 51/50; G02F 1/1368
See application file for complete search history.

(56) References Cited

U.S. PATENT DOCUMENTS

| | | | | |
|---|---|---|---|---|
| 2009/0194767 A1* | 8/2009 | Miura et al. | ..................... | 257/43 |
| 2010/0295042 A1* | 11/2010 | Yano et al. | ..................... | 257/43 |

FOREIGN PATENT DOCUMENTS

| | | |
|---|---|---|
| JP | 2008-311342 | 12/2008 |
| JP | 2011-142310 | 7/2011 |

\* cited by examiner

*Primary Examiner* — David Vu
*Assistant Examiner* — Mouloucoulaye Inoussa
(74) *Attorney, Agent, or Firm* — K&L Gates LLP

(57) ABSTRACT

Disclosed herein is a thin film transistor including: a channel layer made of a crystalline oxide semiconductor having a bixbyte structure, in which (222) planes of the channel layer are roughly parallel to the carrier travel direction.

12 Claims, 10 Drawing Sheets

THIN FILM TRANSISTOR, MANUFACTURING METHOD OF THE SAME AND ELECTRONIC EQUIPMENT

CROSS REFERENCES TO RELATED APPLICATIONS

The present application claims priority to Japanese Priority Patent Application JP 2012-067662 filed in the Japan Patent Office on Mar. 23, 2012, the entire content of which is hereby incorporated by reference.

BACKGROUND

The present disclosure relates to a thin film transistor, manufacturing method of the same and electronic equipment and, more particularly, to a thin film transistor made of a crystalline oxide semiconductor, manufacturing method of the same and electronic equipment using this thin film transistor.

Recent years have seen rapidly increasing display size and frame rate. Further, the competition to develop three-dimensional (3D) display has gotten underway lately. Amid such a backdrop, upgrading the performance of thin film transistors (TFTs) used as pixel switching elements of a display is becoming a necessity.

In particular, an a-Si:H TFT using hydrogenated amorphous silicon (a-Si:H) as its channel layer, i.e., a TFT for use as the above TFT, is approaching its limit in terms of performance. Therefore, brisk efforts are afoot to develop the next generation of TFT materials (refer to Hideo Hosono, Solid State Physics 9, Vol. 44, No. 523, p. 621 (2009)). Of these, transparent amorphous oxide semiconductor (TAOS) materials and indium (In)-based TAOS in particular is drawing attention as a promising material. TAOS is known to be inexpensive and suitable for use over a large area because it can be formed at low temperatures and eliminates the need for steps such as laser annealing following the formation. As a matter of fact, the use of TAOS TFTs for 37-inch displays (LCDs) and 12.1-inch organic EL displays has been reported although this is still in a development stage (refer to J. K. Jeong et al., Soc. Inf. Display Digest 39, 1 (2008) and M.-C. Hung et al., TAOS 2010).

In order to commercialize this TAOS TFT, however, it is necessary to improve its reliability. That is, TAOS has a problem in that oxygen (O), one of the constituent atoms, splits off very easily. It is known that the characteristic changes such as shifting of the threshold voltage ($V_{th}$) occur if oxygen deficiency takes place as a result of the oxygen splitting off from the TAOS. Further, a high mobility of 30 cm$^2$/Vs or more, higher than a mobility of up to 10 cm$^2$/Vs obtained by TAOS, has begun to be sought after because of increasingly high definition and frame rate.

In order to solve these problems, approaches including the annealing of the In-based TAOS film after its formation and the formation of a protective film over the In-based TAOS film are used. However, it is difficult to completely suppress the TFT characteristic changes with these approaches. Basically, eliminating unstable bonds in the In-based TAOS film to the extent possible is considered necessary. Further, materials other than InGaZnO are searched for to improve the mobility.

The use of crystalline materials such as InZnO and InGaZnO4 for the TFT channel layer has been recently reported (refer to Japanese Patent Laid-Open Nos. 2008-311342 and 2011-142310). TFTs using such crystalline materials are expected to provide reduced characteristic variations as compared to TAOS TFT. The reason for this is that these TFTs are believed to be affected to a lesser degree by grain boundary scattering because the carrier conduction in In$_2$O$_3$-based materials is determined by 5 s orbitals (refer to Transparent Conductive Film Technology Compiled by the 166$^{th}$ Commission of Transparent Oxide Photoelectron Materials, the Japan Society for the Promotion of Science). However, the variations in TFT characteristics have yet to be completely suppressed to date.

SUMMARY

In light of the foregoing, it is desirable to provide a thin film transistor made of a crystalline oxide semiconductor that offers a high mobility, minimum characteristic variations and high reliability and a manufacturing method of the same.

It is also desirable to provide high-performance electronic equipment using an excellent thin film transistor as described above.

According to an embodiment of the present disclosure, there is provided a thin film transistor that includes a channel layer. The channel layer is made of a crystalline oxide semiconductor having a bixbyte structure. The (222) planes of the channel layer are roughly parallel to the carrier travel direction.

Further, according to another embodiment of the present disclosure, there is provided a manufacturing method of a thin film transistor that includes a step of forming a channel layer in such a manner that the (222) planes of the channel layer is roughly parallel to the carrier travel direction. The channel layer is made of a crystalline oxide semiconductor having a bixbyte structure.

Still further, according to still another embodiment of the present disclosure, there is provided electronic equipment having a thin film transistor. The thin film transistor includes a channel layer. The channel layer is made of a crystalline oxide semiconductor having a bixbyte structure. The (222) planes of the channel layer are roughly parallel to the carrier travel direction.

In the present disclosure, a crystalline oxide semiconductor having a bixbyte structure may have a C-type rare earth structure, i.e., a scandium oxide structure, and be doped with an impurity. This crystalline oxide semiconductor is selected as necessary from among a group of various oxide materials having a bixbyte structure (having a composition represented by $M_2O_3$ where M is a metal). More specifically, among such oxide materials are Dy$_2$O$_3$, Er$_2$O$_3$, Eu$_2$O$_3$, Gd$_2$O$_3$, Ho$_2$O$_3$, In$_2$O$_3$, La$_2$O$_3$, Lu$_2$O$_3$, β-Mn$_2$O$_3$, Nd$_2$O$_3$, Pr$_2$O$_3$, Sc$_2$O$_3$, Sm$_2$O$_3$, Tb$_2$O$_3$, Tl$_2$O$_3$, Tm$_2$O$_3$, Y$_2$O$_3$ and Yb$_2$O$_3$. Among these oxide materials doped with an impurity are In$_2$O$_3$ doped with Ti (In$_2$O$_3$:Ti), In$_2$O$_3$ doped with Sn (ITO) and Y$_2$O$_3$ doped with Nd (Y$_2$O$_3$:Nd). This crystalline oxide semiconductor is polycrystalline or monocrystalline. The (222) planes of the channel layer made of this crystalline oxide semiconductor are crystal planes on which only metal atoms are arranged.

The carrier mobility of the channel layer is preferably 30 cm$^2$/Vs or more. In this case, the average angle formed by the (222) planes of the channel layer and the carrier travel direction is selected in such a manner as to provide a mobility of 30 cm$^2$/Vs or more. Here, the term "average angle" refers to averaging the angles formed by the (222) planes and the carrier travel direction for crystal grains because this angle varies from one crystal grain to another due to variation in crystal orientation between crystal grains if the crystalline oxide semiconductor is polycrystalline. If the crystalline oxide semiconductor is polycrystalline, and if the crystal planes roughly coincide with each other between the crystal grains, it is likely that a metal-to-metal bond (e.g., In—In bond) linked to the conduction of carriers in the crystal grain boundary will be readily formed even when the crystal axes of the crystal grains are displaced due to in-plane rotation. If the crystalline oxide semiconductor is monocrystalline, the average angle is formed by the crystal planes on which only the metal atoms of this monocrystal are arranged and the carrier travel direction. The average angle formed by the (222) planes and the carrier travel direction is preferably, for example, 0° or more and 25° or less, and more preferably, 0° or more and 10° or less.

The thin film transistor may be a top gate thin film transistor having a channel layer, gate insulating film and gate electrode stacked on and above a substrate in this order or a bottom gate thin film transistor having a gate electrode, gate insulating film and channel layer stacked on and above a substrate in this order. In a top gate thin film transistor, the channel layer is preferably provided above a substrate with an amorphous insulating film having a uniform composition and not containing any impurity disposed therebetween. Oxides such as $AlO_x$ (where x is, for example, 1.2 or more and 1.8 or less), $GaO_x$ (where x is, for example, 1.2 or more and 1.8 or less), $YO_x$ (where x is, for example, 1.2 or more and 1.8 or less) and $LaO_x$ (where x is, for example, 1.2 or more and 1.8 or less) can be used as a material of the amorphous insulating film. In addition, nitrides such as AlN can also be used for the same purpose. A crystal film having a wide band gap, and preferably a crystal film having a uniform composition and not containing any impurity, may be used rather than this amorphous insulating film. Among materials that can be used as this crystal film are $Al_2O_3$, $Ga_2O_3$, $Y_2O_3$, $La_2O_3$ and AlN. On the other hand, the gate insulating film provided on the channel layer may be amorphous or crystalline. The material thereof may be not only $SiO_x$ (where x is, for example, 1.8 or more and 2.2 or less, and $SiO_2$ is also included) and $SiN_x$ (where x is, for example, 1.1 or more and 1.6 or less, $Si_3N_4$ is also included) and $AlO_x$ (where x is, for example, 1.2 or more and 1.8 or less, $Al_2O_3$ is also included) but also any other materials having a wide band gap. However, amorphous $SiO_x$, $SiN_x$ and $AlO_x$ films are preferably used.

Basically, any type of substrate may be used to manufacture a thin film transistor so long as the substrate can withstand the temperatures at which the crystalline oxide semiconductor is formed and other processes are performed, and the type of substrate is selected as necessary. This substrate may be transparent or opaque. Although the material of the transparent substrate is selected as necessary, transparent inorganic materials such as quarts, sapphire and glass and various transparent plastics can be, for example, used. A transparent plastic substrate is used as a flexible transparent substrate. Among transparent plastics are polyethylene terephthalate, polyethylene naphthalate, polycarbonate, polystyrene, polyethylene, polypropylene, polyphenylene sulfide, polyvinylidene fluoride, acetylcellulose, brominated phenoxy, aramids, polyimides, polystyrenes, polyarylates, polysulfones and polyolefins. A silicon substrate is, for example, used as an opaque substrate.

In the manufacturing method of a thin film transistor, the channel layer is preferably formed in an atmosphere containing at least oxygen to promote the crystallization during the formation of the channel layer made of a crystalline oxide semiconductor. Further, annealing may be preferably performed in an atmosphere containing at least oxygen to further promote the crystallization following the formation of the channel layer. Still further, if a top gate thin film transistor is manufactured, an amorphous insulating film, and preferably an amorphous insulating film having a single composition, is formed first on a substrate, followed successively by the formation of a channel layer on top thereof so as to form a channel layer having an excellent crystal orientation. Further, a $SiO_x$ or $AlO_x$ film is preferably formed on the channel layer as a gate insulating film.

Electronic equipment may be a variety of electronic equipment using one or two or more thin film transistors and includes both portable and stationary equipment irrespective of functionality and purpose of use. Among specific examples of electronic equipment are displays such as liquid crystal displays and organic EL displays, cameras, mobile phones, mobile devices, personal computers, gaming machines, car-mounted devices, home electric appliances and industrial products.

If the (222) planes, i.e., crystal planes on which only the metal atoms of the channel layer are arranged, and the carrier travel direction, are roughly parallel to each other as described above, the carriers conduct rapidly in the (222) planes, thus contributing to significantly improved carrier mobility. Further, the channel layer is made of a crystalline oxide semiconductor having a bixbyte structure, thus minimizing variations in thin film transistor characteristics and providing high reliability.

The present disclosure provides a thin film transistor made of a crystalline oxide semiconductor that offers a high mobility, minimum characteristic variations and high reliability. It is possible to implement high performance electronic equipment by using this excellent thin film transistor.

Additional features and advantages are described herein, and will be apparent from the following Detailed Description and the figures.

DETAILED DESCRIPTION

A description will be given below of the modes for carrying out the present disclosure (hereinafter referred to as embodiments). It should be noted that the description will be given in the following order.

1. First embodiment (thin film transistor and manufacturing method of the same)
2. Second embodiment (thin film transistor and manufacturing method of the same)

<1. First Embodiment>
[Thin Film Transistor]

Figure 1:
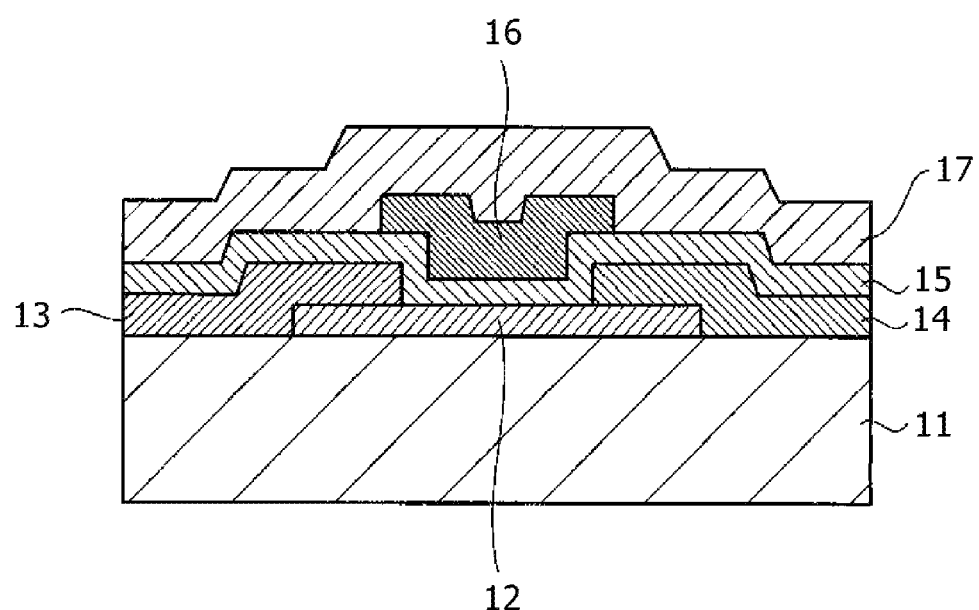
FIG. 1 is a cross-sectional view illustrating a thin film transistor according to a first embodiment.

FIG. 1 illustrates a thin film transistor according to a first embodiment. This thin film transistor is a top gate thin film transistor.

As illustrated in FIG. 1, a channel layer 12 made of a crystalline oxide semiconductor having a bixbyte structure is provided on a substrate 11 in this thin film transistor. A source electrode 13 and drain electrode 14 are provided in ohmic contact with the channel layer 12 in such a manner as to straddle both edges of the channel layer 12. A gate insulating film 15 is provided in such a manner as to cover the channel layer 12, source electrode 13 and drain electrode 14. A gate electrode 16 is provided on the gate insulating film 15. Further, a passivation film 17 is provided in such a manner as to cover the gate electrode 16.

A material is selected, for example, from among those listed above as appropriate for use as the substrate 11 according to the purpose of use of the thin film transistor.

Figure 2:
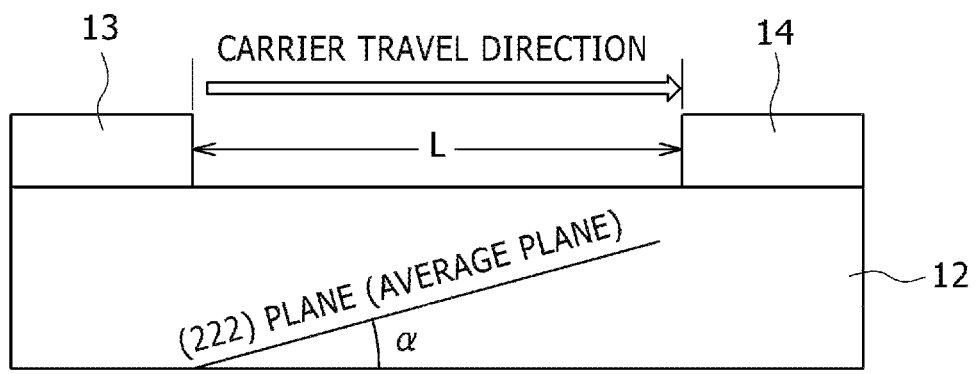
FIG. 2 is a schematic diagram for describing the angle formed by a (222) plane of a channel layer and a carrier travel direction in the thin film transistor according to the first embodiment.

In the channel layer 12, (222) planes, i.e., crystal planes on which only the metal atoms of the crystalline oxide semiconductor having a bixbyte structure making up the channel layer 12 are arranged, and the carrier travel direction, are roughly parallel to each other. More specifically, for example, the average angle between the (222) planes and carrier travel direction is 0° or more and 25° or less. Here, the carrier travel direction is parallel to the surface of the channel layer 12. The thickness of the channel layer 12 is determined according, for example, to the performance necessary for the thin film transistor. A material is selected, for example, from among those listed above as necessary for use as the channel layer 12. FIG. 2 illustrates an average angle α formed by the (222) planes and the carrier travel direction. The channel layer 12 is preferably provided above the substrate 11 with an amorphous insulating film disposed therebetween. An amorphous insulating film having a uniform composition and not containing any impurity such as $AlO_x$ or $GaO_x$ film is preferably used as the amorphous insulating film.

Among materials of the source electrode 13, drain electrode 14 and gate electrode 16 are metals such as platinum (Pt), gold (Au), palladium (Pd), chromium (Cr), molybdenum (Mo), nickel (Ni), aluminum (Al), silver (Ag), tantalum (Ta), tungsten (W), copper (Cu), titanium (Ti), indium (In) and tin (Sn), various alloys containing these metals and various conductive substances such as polycrystalline silicon doped with an impurity. A known conductive metal oxide may be used as a material of the source electrode 13 and drain electrode 14. More specifically, among such conductive metal oxides are ITO, tin oxide ($SnO_2$) and zinc oxide (ZnO). The source electrode 13, drain electrode 14 and gate electrode 16 may have a laminated structure of two or more layers made of any of these substances. The width of the gate electrode 16 along the channel length (gate length) and the distance between the source electrode 13 and drain electrode 14 (channel length L shown in FIG. 2) are selected as appropriate according, for example, to the characteristics necessary for the thin film transistor.

A known material can be used as the gate insulating film 15 and is selected as necessary. More specifically, the material forming the gate insulating film 15 is, for example, $SiO_x$, $SiN_x$ or $AlO_x$. However, it is not limited to these materials. In particular, because the channel layer 12 is made of a crystalline oxide semiconductor in this case, an $AlO_x$ film, i.e., a film previously difficult to apply to TFTs in related art using an amorphous oxide semiconductor film, can be used as the gate insulating film 15. That is, when an amorphous oxide semiconductor film is formed, oxygen leaves the film, for example, because of plasma damage and temperature increase during the film formation. As a result, it is necessary to adjust the threshold voltage by annealing in an atmosphere containing $O_2$ following the film formation. Therefore, it has been difficult to use, as a gate insulating film, an $AlO_x$ film that does not readily pass oxygen or moisture. In contrast, oxygen does not readily leave the film despite plasma and temperature increase during the formation of a crystalline oxide semiconductor film, thus allowing an $AlO_x$ film to be used as a gate insulating film 15. If an $AlO_x$ film is used as the gate insulating film 15 as described above, it is possible to prevent oxygen and moisture from reaching and being adsorbed to the channel layer 12. This makes it possible to prevent characteristic deterioration of the thin film transistor due to adsorption of moisture or other substance to the channel layer 12, thus contributing to improved long-term reliability of the thin film transistor. The thickness of the gate insulating film 15 is selected according, for example, to the performance necessary for the thin film transistor.

A known material may be used as the passivation film 17 and is selected as necessary. More specifically, among materials of the passivation film 17 are silicon dioxide ($SiO_2$), silicon nitride ($SiN_x$ such as $Si_3N_4$), phosphorous silicate glass (PSG), boron silicate glass (BSG), boron phosphorous silicate glass (BPSG). However, the material used as the passivation film 17 is not limited thereto. The thickness of the passivation film 17 is selected as necessary.

[Manufacturing Method of the Thin Film Transistor]

As illustrated in FIG. 1, a crystalline oxide semiconductor having a bixbyte structure is grown on the substrate 11, thus forming the channel layer 12. Then, the channel layer 12 is patterned as necessary by lithography and etching. A known method can be used to grow the crystalline oxide semiconductor and is selected as appropriate. More specifically, among semiconductor growth methods that can be used are pulsed laser deposition (PLD), sputtering, vacuum vapor deposition and chemical vapor deposition (CVD). Although selected as appropriate according to the withstand temperatures of the crystalline oxide semiconductor to be grown and the substrate 11, the growth temperature is generally room temperature or more and 1000° C. or less. If a glass substrate is used as the substrate 11 in particular, the growth temperature is room temperature or more and 400° C. or less. The crystalline oxide semiconductor is doped with an impurity as necessary. In this case, it is possible to control the crystallization state of the crystalline oxide semiconductor with the impurity type and concentration. Further, from the viewpoint of controlling the crystal orientation of the channel layer 12, an amorphous insulting film that becomes completely amorphous is preferably formed on the substrate 11 before forming the channel layer 12, followed by the formation of the channel layer 12 on the amorphous insulating film without exposing the surface thereof to the atmosphere. This is intended to prevent the following. That is, in the presence of moisture or impurity on the surface of the substrate 11 on which the channel layer 12 is to be formed, the moisture or impurity serves as a nucleus, leading to ready formation of crystal grains having different orientations when the channel layer 12 is formed, promoting partial crystallization and resulting in difficulties in achieving uniform orientation. A material having a uniform composition and not containing any impurity such as $AlO_x$ or $GaO_x$ is used as this amorphous insulating film. This is intended to prevent the following. That is, in an amorphous insulating film having a non-uniform composition or containing an impurity, the area having a non-uniform composition or the impurity serves as a nucleus, leading to ready formation of crystal grains having different orientations, promoting partial crystallization and resulting in difficulties in achieving uniform orientation.

Next, a conductive film which will serve as the source electrode 13 and drain electrode 14 is formed, followed by patterning of the conductive film into a given shape by lithography and etching, thus forming the source electrode 13 and drain electrode 14. A known method can be used to form the conductive film and is selected as necessary. More specifically, among methods used to form the conductive film are PLD, sputtering, vacuum vapor deposition and CVD, for example.

Next, the gate insulating film 15 is formed over the entire surface. A known method can be used to form the gate insulating film 15 and is selected as appropriate. More specifically, among methods used to form the gate insulating film are sputtering, vacuum vapor deposition and CVD, for example.

Next, a conductive film which will serve as the gate electrode 16 is formed over the entire surface, followed by patterning of the conductive film into a given shape by lithography and etching, thus forming the gate electrode 16. A known method can be used to form the conductive film and is selected as necessary. More specifically, among methods used to form the conductive film are PLD, sputtering and vacuum vapor deposition, for example.

Next, the passivation film 17 is formed over the entire surface. A known method can be used to form the passivation film 17 and is selected as necessary. More specifically, among methods used to form the passivation film 17 are sputtering, vacuum vapor deposition and CVD, for example.

The target top gate thin film transistor is manufactured through the above process steps.

As described above, in the first embodiment, the (222) planes, i.e., crystal planes on which only the metal atoms of the crystalline oxide semiconductor having a bixbyte structure making up the channel layer 12 are arranged, and the carrier travel direction, are roughly parallel to each other. More specifically, the average angle between the (222) planes and carrier travel direction is, for example, 0° or more and 25° or less. This provides, for example, a high thin film transistor mobility of 30 cm$^2$/Vs or more. Further, the channel layer 12 is made of a crystalline oxide semiconductor, thus minimizing characteristic variations of the thin film transistor and providing high reliability.

<2. Second Embodiment>

[Thin Film Transistor]

Figure 3:
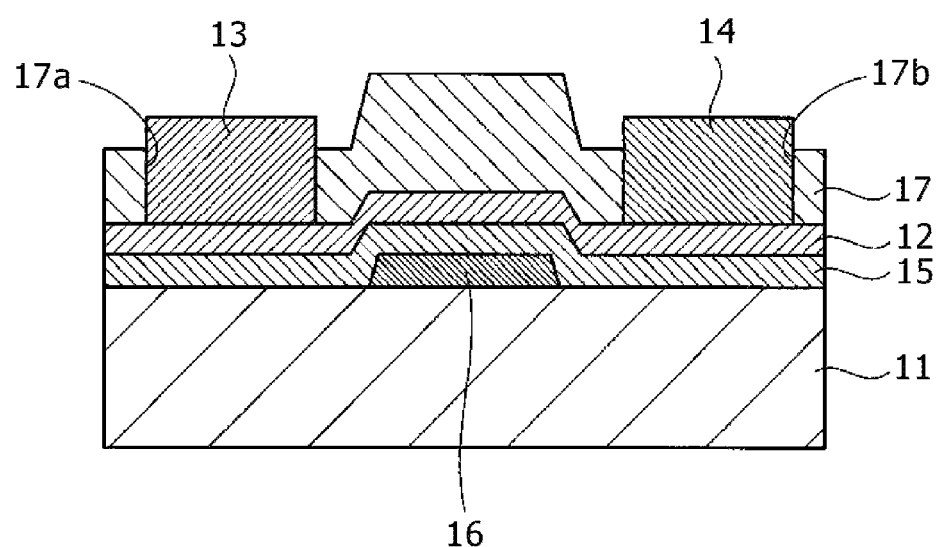
FIG. 3 is a cross-sectional view illustrating a thin film transistor according to a second embodiment.

FIG. 3 illustrates a thin film transistor according to a second embodiment. This thin film transistor is a bottom gate thin film transistor.

As illustrated in FIG. 3, the gate electrode 16 is provided on the substrate 11 in this thin film transistor. The gate insulating film 15 and channel layer 12 are stacked in this order in such a manner as to cover the gate electrode 16. The passivation film 17 is provided in such a manner as to cover the channel layer 12. Openings 17a and 17b are formed at given areas of the passivation film 17. Then, the source electrode 13 is provided in ohmic contact with the channel layer 12 via the opening 17a, and the drain electrode 14 is provided in ohmic contact with the channel layer 12 via the opening 17b.

This thin film transistor is identical to the counterpart according to the first embodiment in all other respects.

[Manufacturing Method of the Thin Film Transistor]

As illustrated in FIG. 3, the gate electrode 16 is formed on the substrate 11 first.

Next, a crystalline oxide semiconductor having a bixbyte structure is grown over the entire surface of the substrate 11 on which the gate electrode 16 has been formed as described above, thus forming the channel layer 12.

Next, the gate insulating film 15 is formed over the entire surface of the channel layer 12.

Next, the passivation film 17 is formed over the entire surface of the gate insulating film 15.

Next, given areas of the passivation film 17 are removed by lithography and etching, thus forming the openings 17a and 17b.

Next, the source electrode 13 and drain electrode 14 are formed respectively in the openings 17a and 17b of the passivation film 17.

The target bottom gate thin film transistor is manufactured through the above process steps.

In the second embodiment, the bottom gate thin film transistor provides the same advantages as in the first embodiment.

<Working Example 1>

A description will be given of working example 1 for the second embodiment.

A bottom gate thin film transistor was manufactured in the following manner.

A SiO$_2$ film of 100 nm in thickness was formed on a glass substrate to ignore the impact of the interface with this glass substrate.

Next, an Mo film of 100 nm in thickness was formed on the SiO$_2$ film to form a gate electrode, followed by patterning of the Mo film into a given shape by lithography and etching, thus forming the gate electrode.

Next, an SiO$_2$ film of 300 nm in thickness was formed to serve as a gate insulating film over the entire surface in such a manner as to cover the gate electrode.

Next, an In$_2$O$_3$ film of 400 nm in thickness was formed to serve as a channel layer over the entire surface of the SiO$_2$ film in an oxygen (O$_2$) atmosphere by a PLD system. The In$_2$O$_3$ film was formed at room temperature with the oxygen pressure set at 8 Pa. As will be described later, the crystallization was successfully promoted during the formation of the In$_2$O$_3$ film by forming the same film under these conditions.

Next, crystallization annealing was performed for one hour at 400° C. in an oxygen atmosphere to promote the crystallization of the In$_2$O$_3$ film.

Next, an SiO$_2$ film of 500 nm in thickness was formed to serve as a passivation film over the entire surface in such a manner as to cover the In$_2$O$_3$ film.

Next, openings were formed by removing given areas of the SiO$_2$ film by etching. Further, a metal film adapted to form source and drain electrodes were formed by vacuum vapor deposition. This metal film was patterned by lithography and etching into a given shape, thus forming the source and drain electrodes.

A bottom gate thin film transistor was formed as described above.

Figure 4:
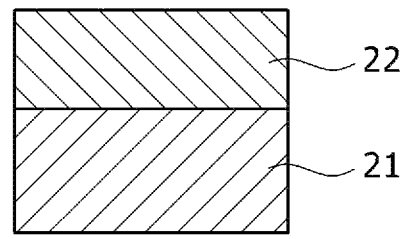
FIG. 4 is a cross-sectional view illustrating a sample used to evaluate the crystallinity of an $In_2O_3$ film.
Figure 5:
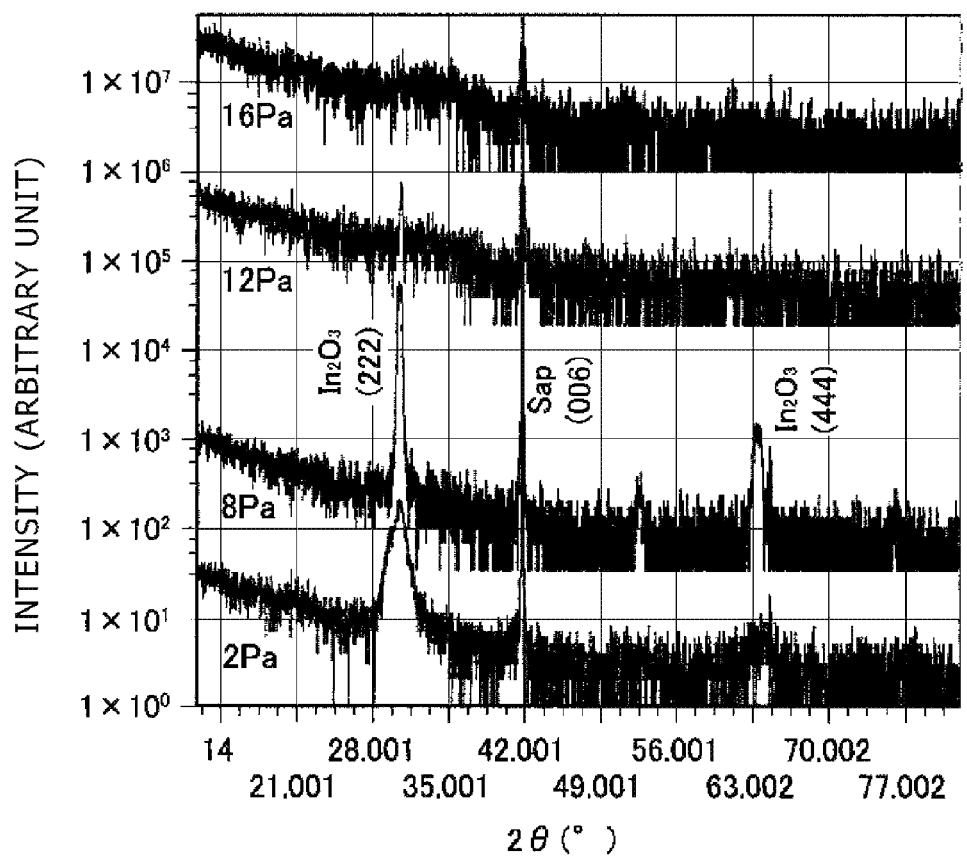
FIG. 5 is a schematic diagram illustrating the results of X-ray diffraction performed on the $In_2O_3$ film.

The change in degree of crystallization of the In$_2$O$_3$ film formed by PLD due to the oxygen pressure was investigated. That is, as illustrated in FIG. 4, an In$_2$O$_3$ film 22 of 400 nm in thickness was formed on a c-plane sapphire substrate 21 at room temperature by a PLD system with the oxygen pressure in the atmosphere varied at four levels, namely, 2 Pa, 8 Pa, 12 Pa and 16 Pa. Then, the degree of crystallization of the In$_2$O$_3$ film was investigated by X-ray diffraction. The investigation results are shown in FIG. 5. The horizontal axis of FIG. 5 is a diffraction angle of 2θ, and the vertical axis the intensity. Here, the reason for using the c-plane sapphire substrate 21 to form the In$_2$O$_3$ film 22 was to improve the alignment accuracy of the X-ray diffraction measurement by using a sharp peak (Sap(006) shown in FIG. 5) of the c-plane sapphire substrate 21, i.e., a monocrystalline substrate, as a reference so as to investigate in detail the crystallization state of the $In_2O_3$ film 22. It has been found from FIG. 5 that the half width of the peak of the (222) planes of the $In_2O_3$ film 22 is the narrowest when the oxygen pressure is 8 Pa, in other words, the $In_2O_3$ film 22 is in the most advanced state of crystallization. This is the reason why the oxygen pressure in the atmosphere was set to 8 Pa during the formation of the $In_2O_3$ film.

Figure 6:
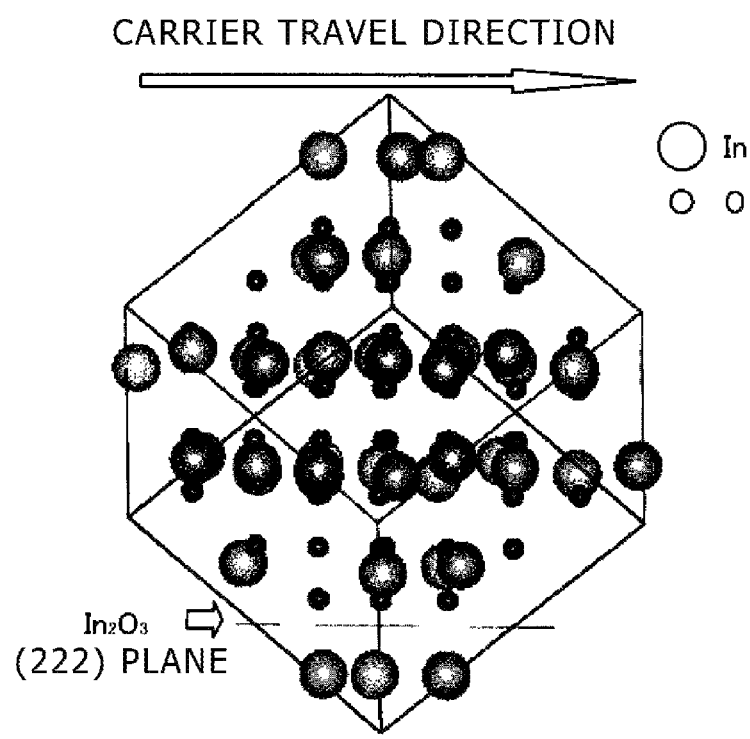
FIG. 6 is a schematic diagram illustrating the structure of an $In_2O_3$ crystal.
Figure 7:
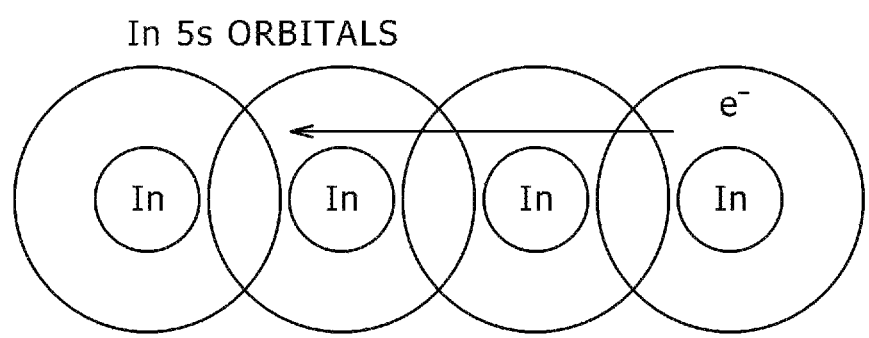
FIG. 7 is a schematic diagram for describing the electron conduction in the (222) plane on which only In atoms of the $In_2O_3$ crystal are arranged.

FIG. 6 illustrates the structure of the $In_2O_3$ crystal. The (222) plane of the $In_2O_3$ crystal is a crystal plane on which the In atoms, i.e., metal atoms, are arranged in a planar manner. In FIG. 6, the large spheres represent the In atoms, and the small spheres the O atoms. FIG. 7 illustrates a conduction model of an electron ($e^-$) in $In_2O_3$. It is known that unlike in ZnO and other materials, electron conduction takes place as a result of the overlap of the 5 s orbitals of the In atoms in $In_2O_3$ rather than that of $sp^3$ hybrid orbitals (refer to Transparent Conductive Film Technology Compiled by the $166^{th}$ Commission of Transparent Oxide Photoelectron Materials, the Japan Society for the Promotion of Science). This mechanism is considered a contributor to high mobility despite the fact that In-based oxide semiconductors are amorphous.

Figure 8A:
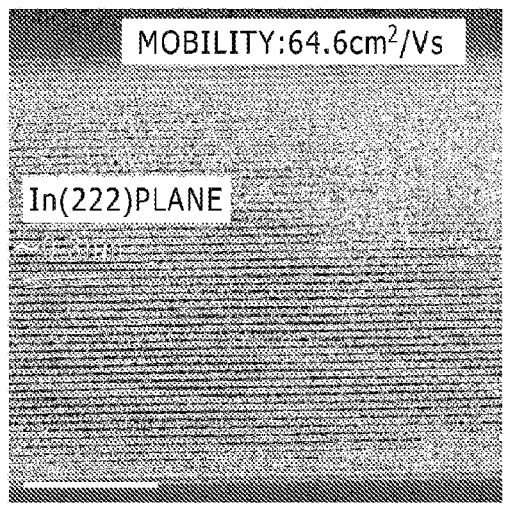
FIGS. 8A and 8B are photographs substituting drawings illustrating high resolution transmission electron microscope images.
Figure 8B:
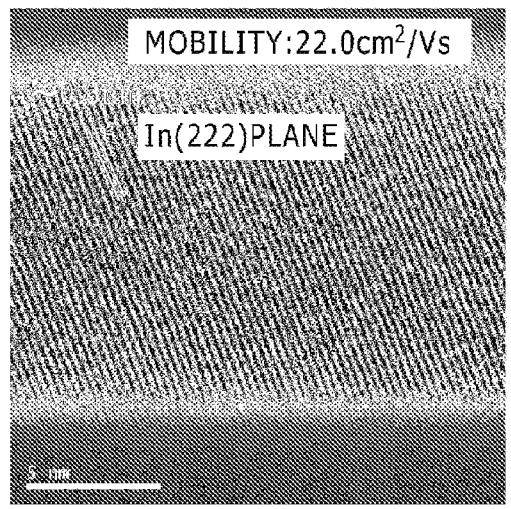

FIGS. 8A and 8B illustrate cross-sectional transmission electron microscope images (cross-sectional TEM images) of the $In_2O_3$ film when the angle between the (222) planes of the $In_2O_3$ film and the carrier travel direction is changed. It should be noted, however, that the $In_2O_3$ film is 20 nm in thickness. FIGS. 8A and 8B also illustrate evaluation results of the Hall mobility. The clearance between the (222) planes of the $In_2O_3$ film is approximately 0.3 nm. In the case shown in FIG. 8A, the (222) planes of the $In_2O_3$ film and the career travel direction are almost parallel to each other. The Hall mobility at this time is significantly large or 64.6 $cm^2$/Vs. It should be noted that it has been confirmed that the (222) planes are almost parallel to the carrier travel direction in the majority of areas of the $In_2O_3$ film within the TEM field of view (about 2 to 4 μm). In the case shown in FIG. 8B, on the other hand, a large angle or about 70° is formed between the (222) planes of the $In_2O_3$ film and the career travel direction. The Hall mobility at this time is small or 22.0 $cm^2$/Vs. This makes it obvious that it is effective to bring the (222) planes of the $In_2O_3$ film closer to parallel to the career travel direction in order to provide a high mobility to the $In_2O_3$ film.

Figure 9:
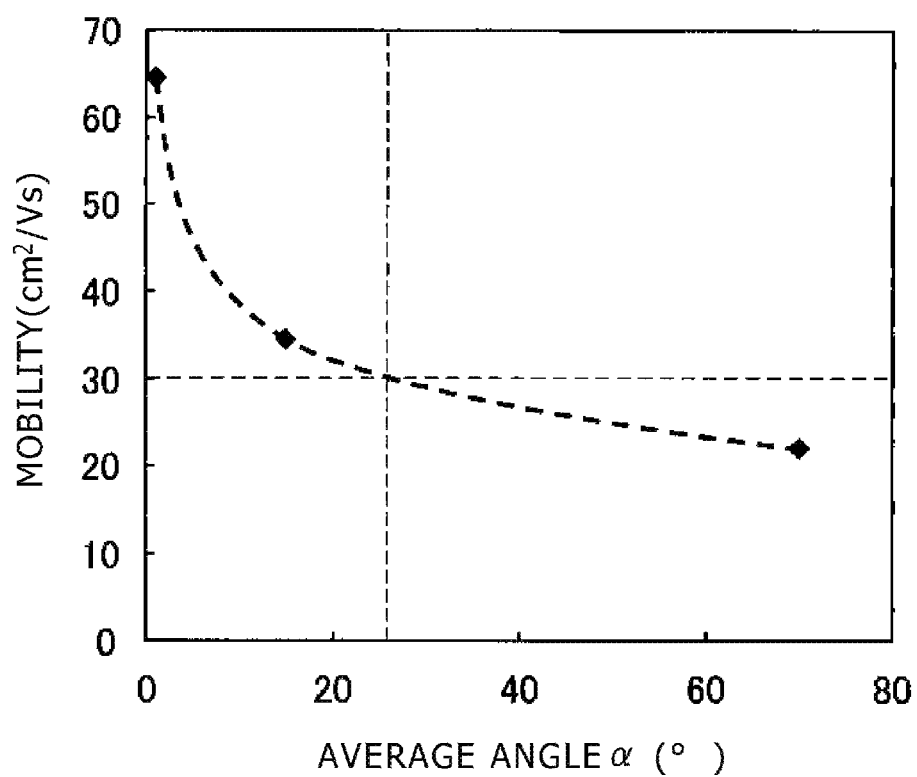
FIG. 9 is a schematic diagram illustrating the relationship between the average angle formed by the (222) planes of the $In_2O_3$ film and the carrier travel direction and mobility.

FIG. 9 illustrates the change in mobility according to the average angle α formed by the (222) planes of the $In_2O_3$ film and the carrier travel direction. It should be noted, however, that the $In_2O_3$ film is 20 nm in thickness. It is clear from FIG. 9 that the average angle α of 0° or more and 25° or less is necessary to achieve a high mobility of 30 $cm^2$/Vs or more.

<Working Example 2>

A description will be given of working example 2 for the second embodiment.

In working example 2, a thin film transistor was manufactured in the same manner as in working example 1 except that an $In_2O_3$:Ti film containing $In_2O_3$ added with Ti was formed by PLD using a PLD system as a target made of $In_2O_3$ containing 1 weight percent of Ti.

Figure 10:
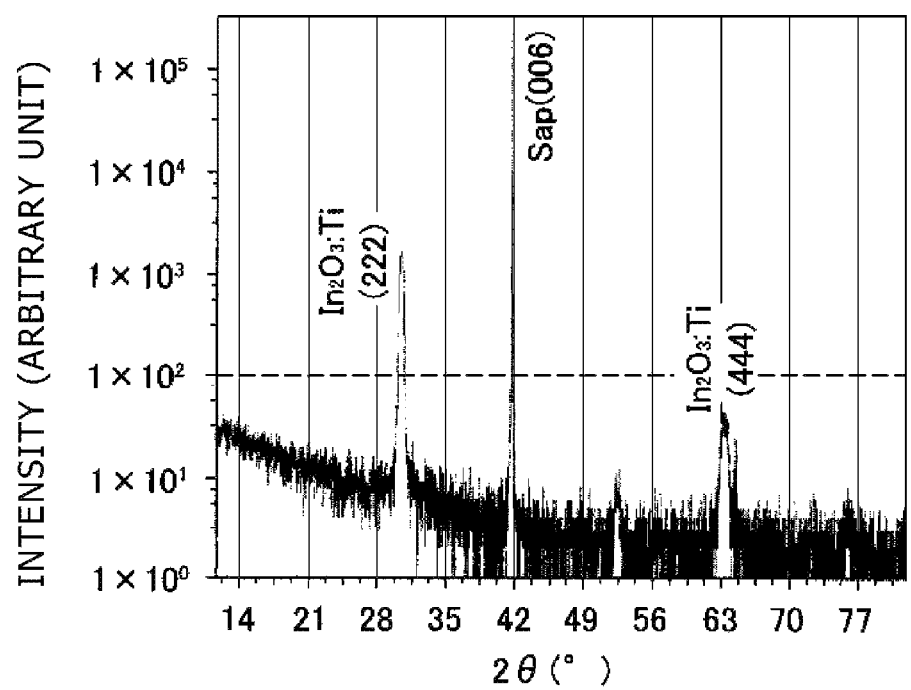
FIG. 10 is a schematic diagram illustrating the result of X-ray diffraction performed on an $In_2O_3$:Ti film.

The degree of crystallization of the $In_2O_3$:Ti film formed by PLD was investigated using X-ray diffraction. The results thereof are shown in FIG. 10. A c-plane sapphire substrate was used to form the $In_2O_3$:Ti film as in working example 1. It is clear from FIG. 10 that the (222) planes of the $In_2O_3$:Ti film are arranged in such a manner as to be almost parallel to the film surface because a peak of the (222) planes with a narrow half width is observed. It has also been found that the mobility of this $In_2O_3$:Ti film is as high as 58 $cm^2$/Vs.

Although the embodiments and working examples have been specifically described, the present application is not limited to the above embodiments and working examples and may be modified in various ways based on the technical concept thereof.

For example, the numerical values, structures, shapes, materials, processes and so on cited in the above embodiments and working examples are merely examples, and numerical values, structures, shapes, materials, processes and so on different therefrom may be used as necessary.

It should be noted that the present application may have the following configurations.

(1) A thin film transistor including:
  a channel layer made of a crystalline oxide semiconductor having a bixbyte structure, in which
  (222) planes of the channel layer are roughly parallel to the carrier travel direction.

(2) The thin film transistor of feature 1, in which
  the channel layer has a carrier mobility of 30 $cm^2$/Vs or more.

(3) The thin film transistor of feature 1 or 2, in which
  the average angle formed by the (222) planes and the carrier travel direction is 0° or more and 25° or less.

(4) The thin film transistor of any one of features 1 to 3, in which
  the crystalline oxide semiconductor having a bixbyte structure is $In_2O_3$.

(5) The thin film transistor of any one of features 1 to 4, in which
  the crystalline oxide semiconductor having a bixbyte structure is doped with an impurity.

(6) The thin film transistor of any one of features 1 to 5, in which
  the channel layer, a gate insulating film and gate electrode are stacked on and above a substrate in this order.

(7) The thin film transistor of any one of features 1 to 5, in which
  the channel layer is provided above the substrate with an amorphous insulating film disposed therebetween.

(8) The thin film transistor of any one of features 1 to 7, in which
  the gate insulating film is an $Al_2O_3$ film.

(9) The thin film transistor of any one of features 1 to 5, in which
  a gate electrode, gate insulating film and the channel layer are stacked on and above a substrate in this order.

(10) A manufacturing method of a thin film transistor including the step of:
  forming a channel layer made of a crystalline oxide semiconductor having a bixbyte structure in such a manner that (222) planes of the channel layer are roughly parallel to the carrier travel direction.

(11) The manufacturing method of a thin film transistor of feature 10, in which
  the channel layer is formed in an atmosphere containing oxygen.

(12) The manufacturing method of a thin film transistor of feature 11, in which
  the channel layer is formed above the substrate with an amorphous insulating film disposed therebetween.

It should be understood that various changes and modifications to the presently preferred embodiments described herein will be apparent to those skilled in the art. Such changes and modifications can be made without departing from the spirit and scope of the present subject matter and The invention is claimed as follows:

1. A thin film transistor comprising: a channel layer made of a crystalline oxide semiconductor having a bixbyite structure, wherein an average angle formed by (222) planes of the channel layer with respect to a carrier travel direction is 0° or more and 25° or less.

2. The thin film transistor of claim 1, wherein the channel layer has a carrier mobility of 30 cm$^2$/Vs or more.

3. The thin film transistor of claim 1, wherein the crystalline oxide semiconductor is $In_2O_3$.

4. The thin film transistor of claim 1, wherein the crystalline oxide semiconductor is doped with an impurity.

5. The thin film transistor of claim 1, wherein the channel layer, a gate insulating film and gate electrode are stacked on and above a substrate in this order.

6. The thin film transistor of claim 5, in which the channel layer is provided above the substrate with an amorphous insulating film disposed therebetween.

7. The thin film transistor of claim 5, wherein the gate insulating film is an $Al_2O_3$ film.

8. The thin film transistor of claim 1, wherein a gate electrode, gate insulating film and the channel layer are stacked on and above a substrate in this order.

9. A manufacturing method of a thin film transistor comprising:
    forming a channel layer made of a crystalline oxide semiconductor having a bixbyite structure in such a manner that the average angle formed by (222) planes of the channel layer and the carrier travel direction is 0° or more and 25° or less.

10. The manufacturing method of a thin film transistor of claim 9, wherein the channel layer is formed in an atmosphere containing oxygen.

11. The manufacturing method of a thin film transistor of claim 10, wherein the channel layer is formed above the substrate with an amorphous insulating film disposed therebetween.

12. Electronic equipment having a thin film transistor, the thin film transistor comprising:
    a channel layer made of a crystalline oxide semiconductor having a bixbyite structure, in which the average angle formed by (222) planes of the channel layer and the carrier travel direction is 0° or more and 25° or less.

* * * * *